(12) United States Patent
Barany et al.

(10) Patent No.: US 11,129,286 B2
(45) Date of Patent: Sep. 21, 2021

(54) POWER SUPPLY NOISE SUPPRESSOR

(71) Applicant: PPC BROADBAND, INC., East Syracuse, NY (US)

(72) Inventors: David A. Barany, Syracuse, NY (US); Timothy John Welch, East Syracuse, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

(21) Appl. No.: 16/502,549

(22) Filed: Jul. 3, 2019

(65) Prior Publication Data

US 2020/0022276 A1 Jan. 16, 2020

Related U.S. Application Data

(60) Provisional application No. 62/697,234, filed on Jul. 12, 2018.

(51) Int. Cl.
| | | |
|---|---|---|
| *H04B 15/02* | (2006.01) | |
| *H05K 5/02* | (2006.01) | |
| *H05K 7/14* | (2006.01) | |
| *H04N 21/61* | (2011.01) | |

(52) U.S. Cl.
CPC .......... *H05K 5/0217* (2013.01); *H04B 15/02* (2013.01); *H05K 5/0204* (2013.01); *H05K 5/0247* (2013.01); *H05K 7/1457* (2013.01); *H04N 21/6168* (2013.01)

(58) Field of Classification Search
None
See application file for complete search history.

(56) References Cited

U.S. PATENT DOCUMENTS

| | | | |
|---|---|---|---|
| 9,171,661 B2 | 10/2015 | Terakawa | |
| 9,277,684 B2* | 3/2016 | Laurent | H05K 9/0007 |
| 9,331,660 B2 | 5/2016 | Aizawa | |
| 9,692,291 B2 | 6/2017 | Ohoka et al. | |
| 2006/0137891 A1* | 6/2006 | Berens | H01F 17/06 174/36 |
| 2008/0246576 A1* | 10/2008 | Terlizzi | H01F 17/06 336/175 |
| 2009/0183935 A1* | 7/2009 | Tsuchiya | H01M 2/1083 180/68.1 |
| 2014/0326499 A1* | 11/2014 | Ohashi | H03H 1/0007 174/70 B |
| 2015/0146336 A1* | 5/2015 | Girard | H04M 3/18 361/119 |

(Continued)

OTHER PUBLICATIONS

Lee W. Young, International Search Report and Written Opinion dated Sep. 26, 2019, PCT Application No. PCT/US2019/040517, pp. 1-10.

*Primary Examiner* — Courtney L Smith
(74) *Attorney, Agent, or Firm* — MH2 Technology Law Group LLP (57) ABSTRACT

A power supply noise suppressor includes a housing configured to be fastened or adhered to a customer-premises equipment (CPE) device. A first connector is configured to connect to a cable. A second connector is configured connect to the CPE device. A circuit is positioned at least partially within the housing and connected to the first and second connectors. The circuit is configured to reduce an amount of a power supply switch noise that is transmitted in an upstream direction from the CPE device to the cable.

19 Claims, 6 Drawing Sheets

(56) References Cited

U.S. PATENT DOCUMENTS

2015/0244339 A1    8/2015  Craig
2017/0093357 A1*  3/2017  Okada .................. H05K 9/0066
2019/0362868 A1*  11/2019  Yamagishi ............... H01B 7/02

* cited by examiner

POWER SUPPLY NOISE SUPPRESSOR

CROSS-REFERENCE TO RELATED APPLICATIONS

This patent application claims priority to U.S. Provisional Patent Application No. 62/697,234, filed on Jul. 12, 2018, which is incorporated herein by reference.

BACKGROUND

Customer-premises equipment (CPE) refers to any terminal and associated equipment located at a customer's premises that is connected with a carrier's telecommunication circuit. CPE devices may include telephones, modems, routers, network switches, residential gateways, set-top boxes, fixed mobile convergence products, home networking adapters, and Internet access gateways.

Some CPE devices radiate power supply switch noise. As used herein, "power supply switch noise" refers to noise that is generated by a switch mode power supply/converter within the circuitry of the CPE device. For example, when a coaxial cable has a loose connection with a CPE device (e.g., at the back of a modem), power supply switch noise may be generated within the CPE device. More particularly, a cable shield of the coaxial cable, which is no longer grounded, picks up the power supply switch noise, which is then coupled to and/or transmitted along a center conductor of the coaxial cable in an upstream direction. The noise then exits the user's premises in upstream (e.g., return) signals at about 23 MHz, which may affect other users and/or the headend. In addition, the noise may disable the return laser or mask return signals.

A ferrite can be used to absorb some of the radiated noise. However, cables with ferrites can be removed (i.e., disconnected) by users if/when the CPE device is relocated. Thus, it would be desirable to have a system and method for reducing power supply switch noise that is permanently coupled to the CPE device (i.e., cannot be removed or disconnected by a user).

SUMMARY

A power supply noise suppressor is disclosed. The power supply noise suppressor includes a housing configured to be coupled to a customer-premises equipment (CPE) device with a fastener. The housing defines an internal volume. The housing includes a main portion and a protrusion portion. The protrusion portion extends from the main portion in a first direction and a second direction. The first direction is substantially perpendicular to the second direction. A first connector extends through the main portion in the first direction. The first connector is configured to connect to a coaxial cable. A second connector extends through the protrusion portion in a third direction that is opposite to the first direction. The second connector is configured to connect to a port of the CPE device. A wire is positioned at least partially within the internal volume. The wire is connected to and positioned between the first connector and the second connector. A ferrite sleeve is positioned at least partially within the internal volume. The ferrite sleeve is configured to reduce an amount of noise that is transmitted from the CPE device to the coaxial cable.

In another embodiment, the power supply noise suppressor includes a housing configured to be coupled to a customer-premises equipment (CPE) device. The housing defines an internal volume. A first connector is configured to connect to a coaxial cable. A second connector is configured to connect to a port of the CPE device. A wire is positioned at least partially within the internal volume. The wire is connected to and positioned between the first connector and the second connector. A noise attenuator is positioned at least partially within the internal volume. The noise attenuator is configured to reduce an amount of a power supply switch noise that is transmitted from the CPE device to the coaxial cable.

In another embodiment, the power supply noise suppressor includes a housing configured to be fastened or adhered to a customer-premises equipment (CPE) device. A first connector is configured to connect to a cable. A second connector is configured connect to the CPE device. A circuit is positioned at least partially within the housing and connected to the first and second connectors. The circuit is configured to reduce an amount of a power supply switch noise that is transmitted in an upstream direction from the CPE device to the cable.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

DETAILED DESCRIPTION

The present disclosure relates to systems and methods for reducing power supply switch noise in a CPE device. More particularly, the systems and methods may reduce the amount of power supply switch noise that is transmitted from the CPE device in an upstream direction, which may affect other users and/or the headend. The power supply switch noise may be reduced using a power supply noise suppressor. The power supply noise suppressor may reduce the noise by about 5 dB to about 20 dB or about 10 dB to about 15 dB while not adding/contributing loss in the signal path. The power supply noise suppressor may also be cost-effective, field-upgradeable, and is coupled to the CPE device (e.g., modem) such that it is unlikely to be removed by a user.

Figure 1:
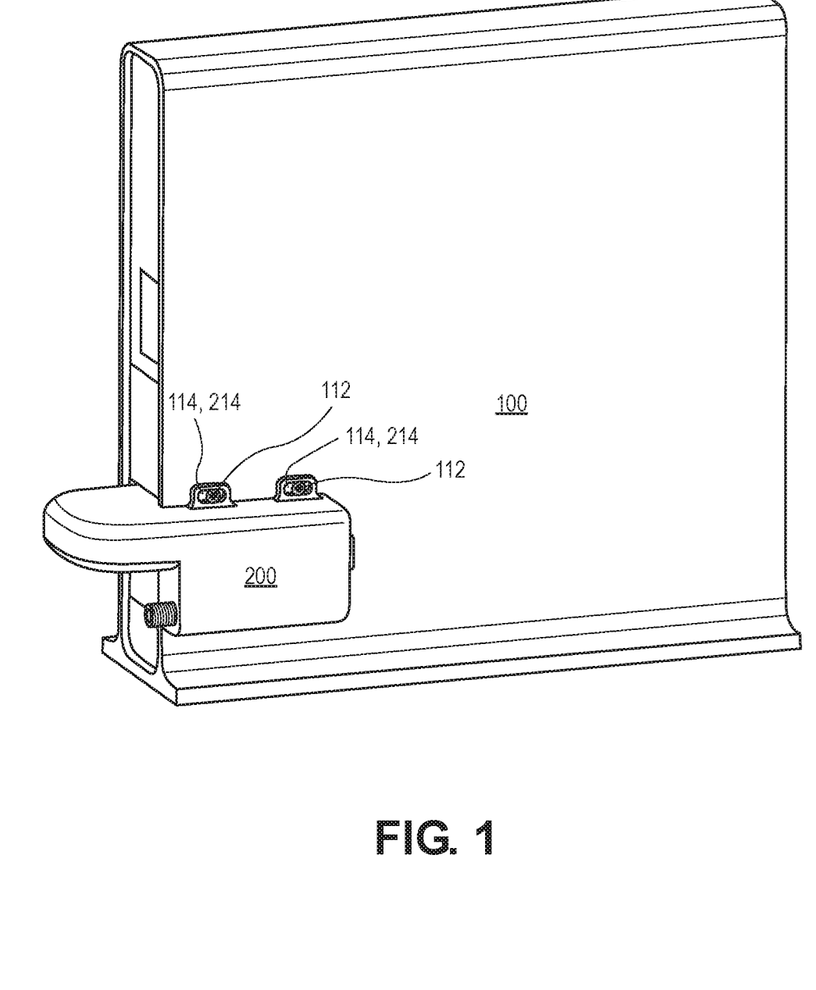
FIG. 1 illustrates a perspective view of a customer-premises equipment (CPE) device with a power supply noise suppressor coupled thereto, according to an embodiment.
Figure 2:
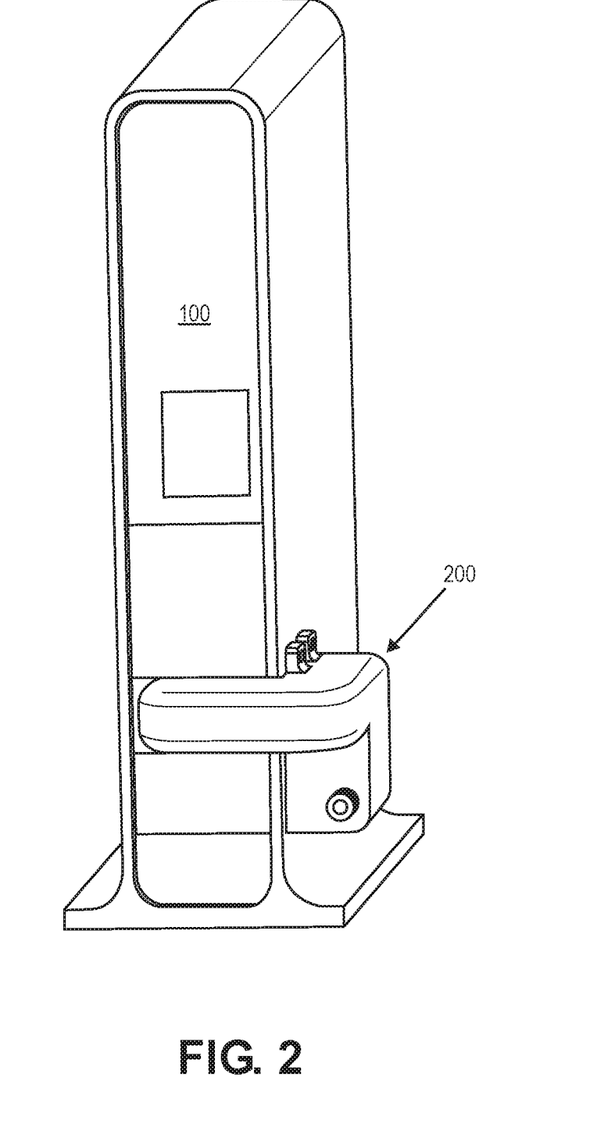
FIG. 2 illustrates an end view of the CPE device with the power supply noise suppressor coupled thereto, according to an embodiment.

FIGS. 1 and 2 illustrate a perspective view and an end view, respectively, of a CPE device 100 with a power supply noise suppressor 200 coupled thereto, according to an embodiment. The CPE device 100 may be or include a telephone, a modem, a router, a network switch, a residential gateway, a set-top box, a fixed mobile convergence product, a home networking adapter, and/or an Internet access gateway. In the example shown in FIGS. 1 and 2, the CPE device 100 is a modem. The CPE device 100 may be located at or within a user's premises. The user may be or include a customer and/or a subscriber.

The power supply noise suppressor 200 may be connected to an F-port of the CPE device 100. Thus, the power supply noise suppressor 200 may cover up (e.g., hide) the F-port, which may prevent a cable from being connected (e.g., directly) to the F-port. Thus, because the F-port is covered up, a security sleeve (for preventing connection to the F-port) may be omitted.

In addition to being connected to the F-port of the CPE device 100, the power supply noise suppressor 200 may also be permanently coupled to the CPE device 100 (e.g., to the housing of the CPE device 100), so that the user/customer/subscriber cannot de-couple it therefrom. As shown, the power supply noise suppressor 200 may be coupled to the CPE device 100 using fasteners (e.g., screws, bolts, etc.) 112 that extend through aligned openings 114 in the CPE device 100 and openings 214 in power supply noise suppressor 200. The openings 114 in the CPE device 100 may be existing vent openings. In another embodiment, the power supply noise suppressor 200 may be coupled to the CPE device 100 by a service technician using a special tool (e.g., a key). Once installed, the power supply noise suppressor 200 cannot be easily de-coupled from the CPE device 100 by the user/customer/subscriber, e.g., without damaging the CPE device 100 and/or the noise suppressor 200. Rather, the power supply noise suppressor 200 can generally only be de-coupled from the CPE device 100 by the service technician using the special tool. In another embodiment, the power supply noise suppressor 200 may be coupled to the CPE device 100 using an adhesive (e.g., glue or double-sided sticky tape). In another embodiment, the power supply noise suppressor 200 may be positioned at least partially within the CPE device 100.

Figure 3:
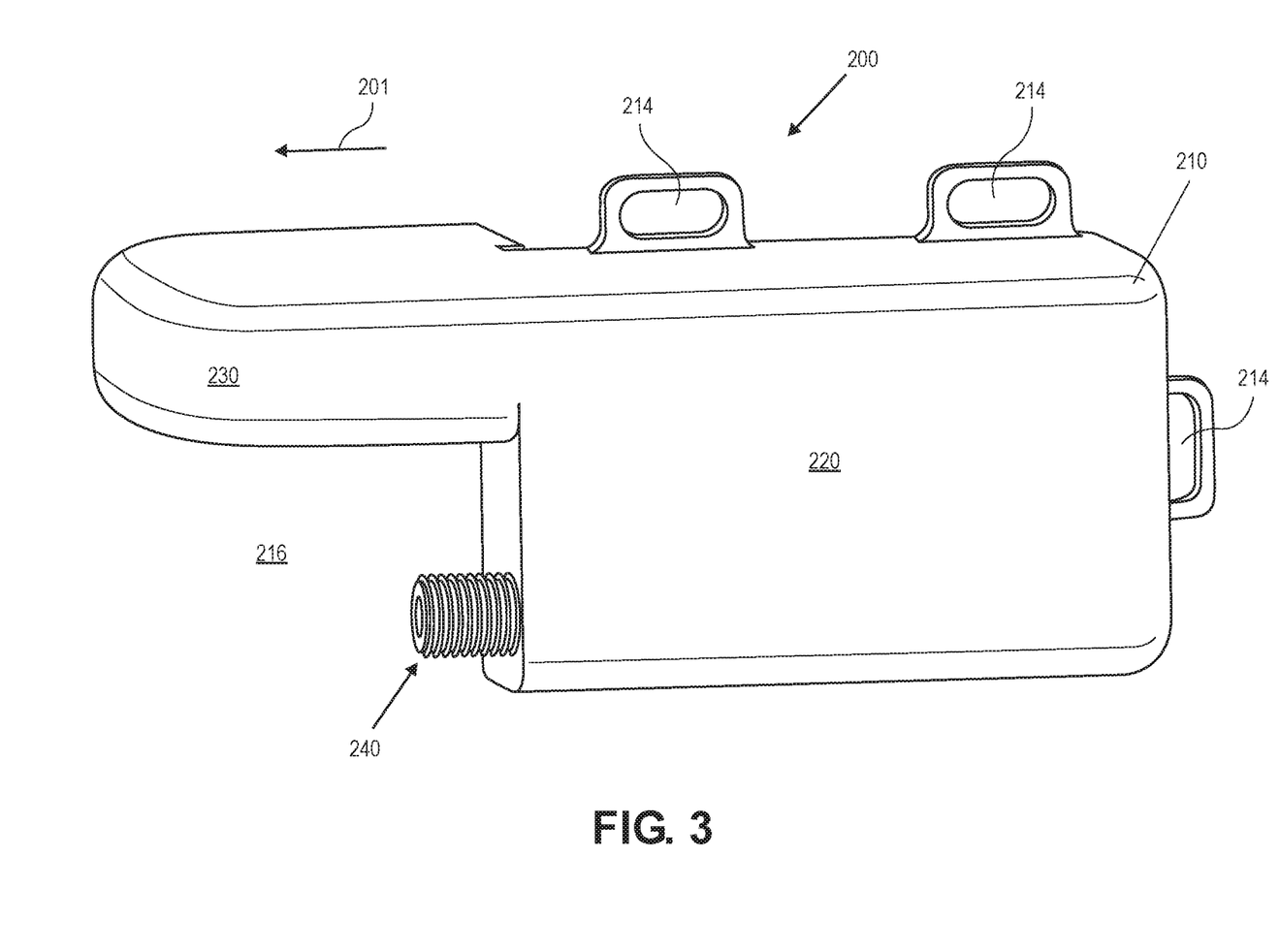
FIG. 3 illustrates a side view of the power supply noise suppressor, according to an embodiment.

FIG. 3 illustrates a side view of the power supply noise suppressor 200, according to an embodiment. The power supply noise suppressor 200 may include a housing 210 defining an internal volume. As mentioned above, the housing 210 may define one or more openings (three are shown, and all indicated as 214). The openings 214 may be configured to have the above-mentioned fasteners 112 extend therethrough to couple the power supply noise suppressor 200 to the CPE device 100.

The housing 210 may include a first (e.g., main) portion 220 and a second (e.g., protrusion) portion 230. The protrusion portion 230 may be coupled to or integral with the main portion 220. The protrusion portion 230 may extend in a first direction 201 from the main portion 220 (e.g., to the left as shown in FIG. 3). A recess 216 may be defined at least partially by the main portion 220 and/or the protrusion portion 230. As shown, the recess 216 may be positioned below the protrusion portion 230.

A first connector 240 may be coupled to the main portion 220. The first connector 240 may extend from the main portion 220 in the first direction 201 (e.g., parallel to the protrusion portion 230). Thus, the first connector 240 may be positioned below the protrusion portion 230 and/or extend toward/into the recess 216. In another embodiment, the first connector 240 may be coupled to and/or extend from the protrusion portion 230 (e.g., in the first direction 201).

The first connector 240 may be configured to connect to a coaxial line (e.g., of cable television (CATV) system). The first connector 240 may be configured to transmit downstream and/or upstream signals in a CATV bandwidth, a multimedia over coax alliance (MoCA) bandwidth, or both.

Figure 4:
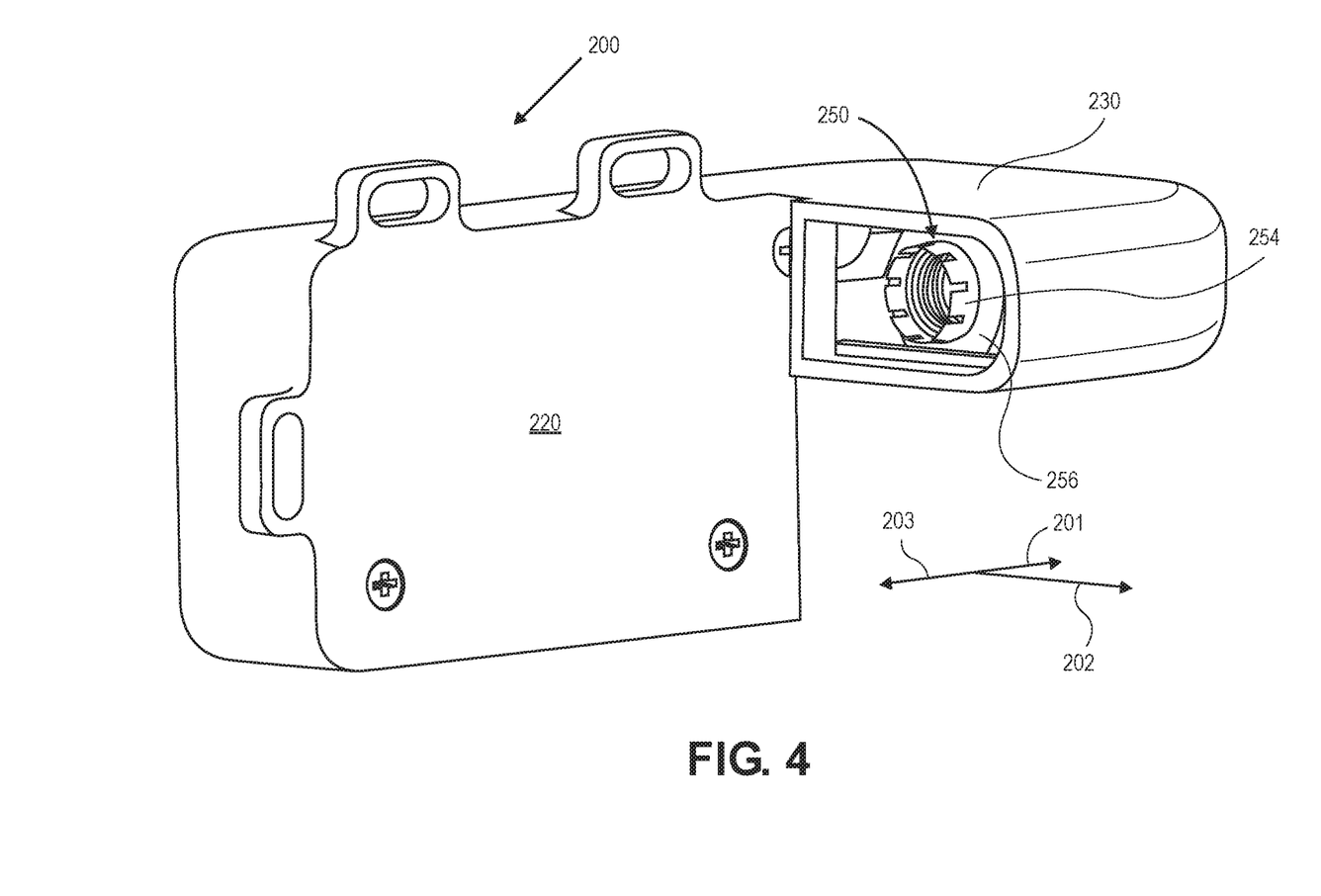
FIG. 4 illustrates a perspective view of the power supply noise suppressor, according to an embodiment.
Figure 5:
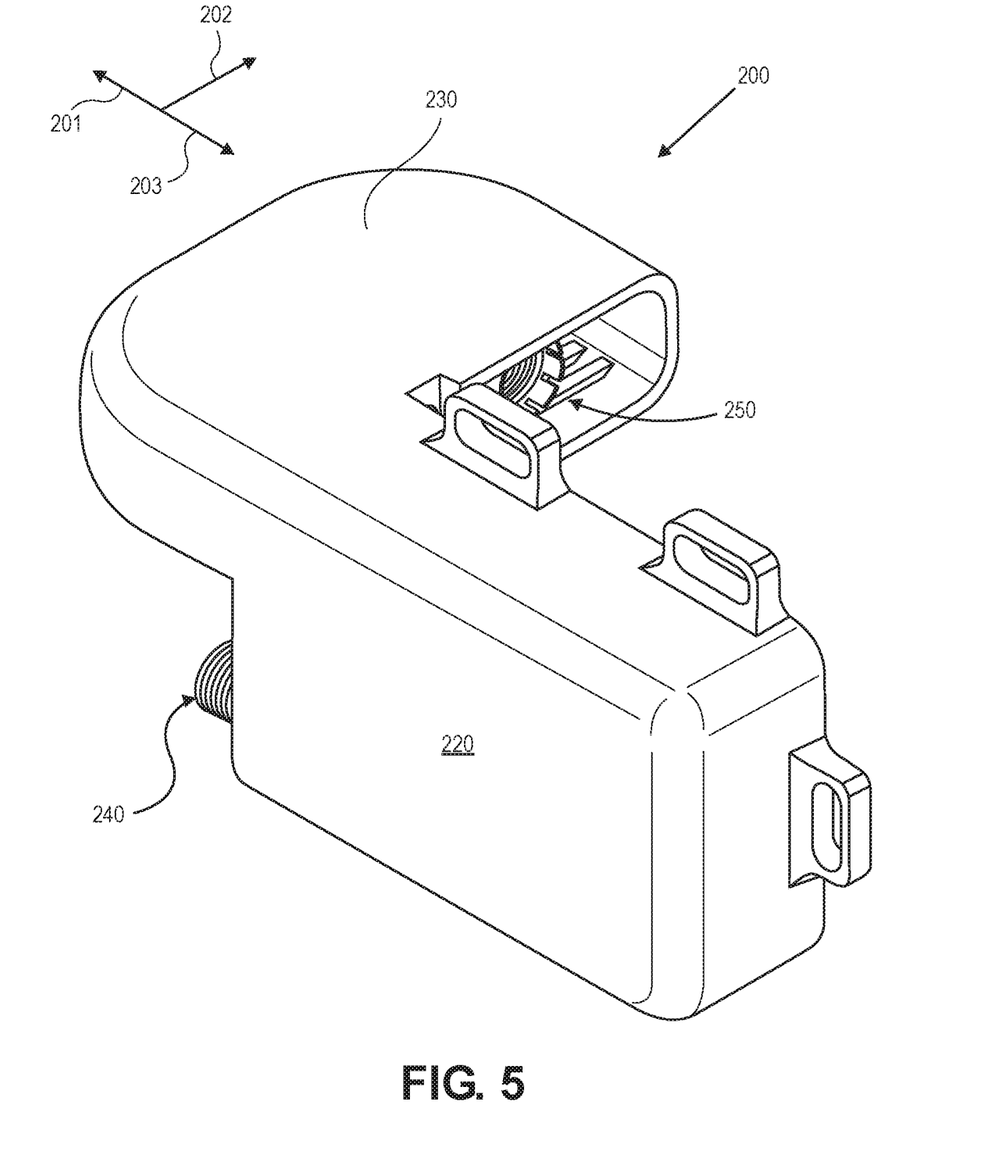
FIG. 5 illustrates another perspective view of the power supply noise suppressor, according to an embodiment.

FIGS. 4 and 5 illustrate perspective views of the power supply noise suppressor 200, according to an embodiment. The protrusion portion 230 may also extend in a second direction 202 from the main portion 220 that is perpendicular to the first direction 201. Thus, it may appear as if the protrusion portion 230 is rotated 90° with respect to the main portion 220. A second connector 250 may be coupled to the protrusion portion 230. The second connector 250 may extend in a third direction 203 from the protrusion portion 230. The third direction 203 may be parallel to, but opposite of, the first direction 201. Thus, the first and second connectors 240, 250 may face opposite directions.

The second connector 250 may be configured to connect to the F-port of the CPE device 100. The second connector 250 may be configured to transmit upstream and/or downstream signals between the coaxial cable (connected to the first connector 240) and the CPE device 100 in the CATV bandwidth, the MoCA bandwidth, or both.

The second connector 250 may include a crown 254 and a ring 256. The crown 254 may be a mock and/or fingered crown that is configured to push onto the F-port of the CPE device 100. The crown 254 may be positioned at least partially within the ring 256. The ring 256 may be a flat and/or push ring configured to act as a shoulder or stop to limit the axial movement of the second connector 250 with respect to the F-port.

Figure 6:
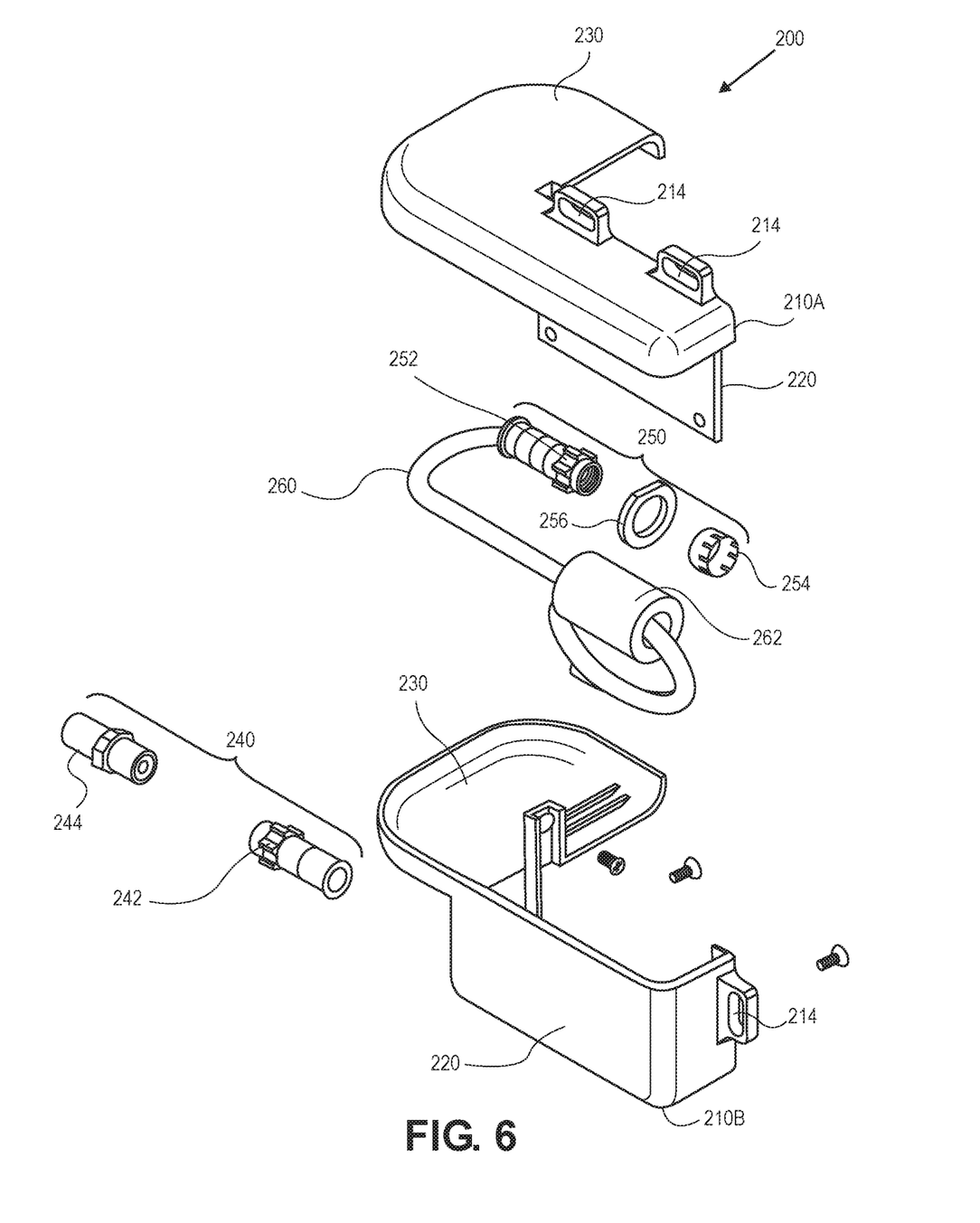
FIG. 6 illustrates an exploded perspective view of the power supply noise suppressor, according to an embodiment.

FIG. 6 illustrates an exploded perspective view of the power supply noise suppressor 200, according to an embodiment. The housing 210 may include a first (e.g., upper) portion 210A and a second (e.g., lower) portion 210B. The upper and lower portions 210A, 210B may each form a part of the main portion 220 and/or the protrusion portion 230. The upper and lower portions 210A, 210B may at least partially define the internal volume.

The internal volume may have a circuit positioned therein. The circuit may include one or more wires (one is shown: 260). The circuit may also include a noise attenuator 262 that is coupled to the wire 260 and/or positioned at least partially around the wire 260. The noise attenuator 262 may be configured to absorb and/or reduce at least some of the noise generated by/in the CPE device 100. More particularly, the noise attenuator 262 may be configured to reduce at least some of the noise in the upstream signals that are transmitted from the CPE device 100, through the power supply noise suppressor 200, and into the coaxial cable (e.g., toward the headend). The noise attenuator 262 may be or include a monocular ferrite sleeve.

The opposing ends of the wire 260 may be connected to the first and second connectors 240, 250. In the embodiment shown, the first connector 240 may include an inner portion 242 and an outer portion 244. The inner portion 242 may be connected to and/or positioned between the wire 260 and the outer portion 244. The inner portion 242 may be positioned at least partially within the housing 210, and the outer portion 244 may be positioned at least partially outside of the housing 210. The inner portion 242 may be or include a compression connector (e.g., mini, F, signal tight). The outer portion 244 may be or include an M-type female splice connector.

The second connector 250 may include an inner portion 252, the crown 254, and/or the ring 256. In one embodiment, the crown 254 and/or the ring 256 may be omitted such that the inner portion 252 may connect directly to the F-port. The inner portion 252 may be connected to and/or positioned between the wire 260 and the crown 254. The inner portion 252 may be positioned at least partially within the housing 210, and the crown 254 and/or the ring 256 may be positioned at least partially outside of the housing 210. The inner portion 252 may be or include a compression connector (e.g., mini, F, signal tight).

As mentioned above, in a conventional system (e.g., without the power supply noise suppressor 200), a loose connection between a coaxial cable and an F-port on the CPE device 100 may result in noise that is transmitted upstream through the coaxial cable. The power supply noise suppressor 200, when connected between the coaxial cable and the CPE device 100, may reduce or eliminate such noise, even if the connection between the coaxial cable and first connector 240 of the power supply noise suppressor 200 is loose, and/or even if the connection between the second connector 250 of the power supply noise suppressor 200 and the F-port of the CPE device 100 is loose. More particularly, the noise attenuator 262 may reduce or eliminate the noise, even in the presence of a loose connection.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. The present disclosure is not to be limited in terms of the particular embodiments described in this application, which are intended as illustrations of various aspects. Many modifications and variations can be made without departing from its spirit and scope, as will be apparent to those skilled in the art. Functionally equivalent apparatuses within the scope of the disclosure, in addition to those enumerated herein will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group.

What is claimed is:

1. A power supply noise suppressor, comprising:
   a housing configured to be coupled to a customer-premises equipment (CPE) device with a fastener, wherein the housing defines an internal volume, wherein the housing comprises a main portion and a protrusion portion, wherein the protrusion portion extends from the main portion in a first direction and a second direction, and wherein the first direction is substantially perpendicular to the second direction;
   a first connector extending through the main portion in the first direction, wherein the first connector is configured to connect to a coaxial cable;
   a second connector extending through the protrusion portion in a third direction that is opposite to the first direction, wherein the second connector is configured to connect to a port of the CPE device;
   a wire positioned at least partially within the internal volume, wherein the wire is connected to and positioned between the first connector and the second connector; and
   a noise attenuator positioned at least partially within the internal volume, wherein the noise attenuator is configured to reduce an amount of noise that is transmitted from the CPE device to the coaxial cable.

2. The power supply noise suppressor of claim 1, wherein the first connector comprises:

an inner portion that is positioned at least partially within the internal volume, wherein the inner portion comprises a compression connector; and an outer portion that is positioned at least partially outside of the internal volume, wherein the outer portion is coupled to the inner portion, and wherein the outer portion comprises a splice connector.

3. The power supply noise suppressor of claim 1, wherein the second connector comprises:

an inner portion that is positioned at least partially within the internal volume, wherein the inner portion comprises a compression connector;

a ring positioned at least partially around the inner portion; and a crown positioned at least partially around the inner portion.

4. The power supply noise suppressor of claim 1, wherein the noise attenuator comprises a ferrite sleeve and the wire is wrapped around the ferrite sleeve, and wherein the wire extends through the ferrite sleeve.

5. The power supply noise suppressor of claim 1, wherein the housing is configured to be coupled to the CPE device using a fastener.

6. A power supply noise suppressor, comprising:

a housing configured to be coupled to a customer-premises equipment (CPE) device, wherein the housing defines an internal volume;

a first connector configured to connect to a coaxial cable;

a second connector configured to connect to a port of the CPE device;

a wire positioned at least partially within the internal volume, wherein the wire is connected to and positioned between the first connector and the second connector;

a noise attenuator positioned at least partially within the internal volume, wherein the noise attenuator is configured to reduce an amount of a power supply switch noise that is transmitted from the CPE device to the coaxial cable.

7. The power supply noise suppressor of claim 6, wherein the housing comprises:

a main portion; and a protrusion portion, wherein the protrusion portion extends from the main portion in a first direction and a second direction, and wherein the first direction is substantially perpendicular to the second direction.

8. The power supply noise suppressor of claim 7, wherein the first connector extends through the main portion in the first direction.

9. The power supply noise suppressor of claim 8, wherein the first connector comprises:

an inner portion that is positioned at least partially within the internal volume, wherein the inner portion comprises a compression connector; and an outer portion that is positioned at least partially outside of the internal volume, wherein the outer portion is coupled to the inner portion, and wherein the outer portion comprises an M-type female splice connector.

10. The power supply noise suppressor of claim 8, wherein the second connector extends through the protrusion portion in a third direction that opposes the first direction.

11. The power supply noise suppressor of claim 10, wherein the second connector is configured to connect to an F-port of the CPE device.

12. The power supply noise suppressor of claim 11, wherein the second connector comprises:

an inner portion that is positioned at least partially within the internal volume, wherein the inner portion comprises a compression connector;

a ring positioned at least partially around the inner portion; and a crown positioned at least partially around the inner portion.

13. The power supply noise suppressor of claim 6, wherein the housing is configured to be coupled to the CPE device using an adhesive.

14. The power supply noise suppressor of claim 6, wherein the noise attenuator comprises a ferrite sleeve that is positioned around the wire.

15. The power supply noise suppressor of claim 6, wherein the noise attenuator is configured to reduce the amount of the power supply switch noise even if the coaxial cable is loosely connected to the first connector such that a cable shield of the coaxial cable conducts a portion of the power supply switch noise and transmits the portion of the power supply switch noise along a center conductor of the coaxial cable.

16. A power supply noise suppressor, comprising:

a housing configured to be fastened or adhered to a customer-premises equipment (CPE) device;

a first connector configured to connect to a cable;

a second connector configured connect to the CPE device; and a circuit positioned at least partially within the housing and connected to the first and second connectors, wherein the circuit is configured to reduce an amount of a power supply switch noise that is transmitted in an upstream direction from the CPE device to the cable, wherein the second connector is configured to connect to an F-port of the CPE device.

17. The power supply noise suppressor of claim 16, wherein the circuit comprises:

a wire positioned at least partially within the housing, wherein the wire is connected to and positioned between the first connector and the second connector; and a noise attenuator positioned at least partially within the housing and around the wire, wherein the noise attenuator is configured to reduce the amount of the power supply switch noise that is transmitted in the upstream direction from the CPE device to the cable.

18. The power supply noise suppressor of claim 17, wherein the housing is configured to be coupled to and de-coupled from the CPE device using a key.

19. The power supply noise suppressor of claim 17, wherein the amount of power supply switch noise is from about 5 dB to about 20 dB.

* * * * *